(12) United States Patent
Ishii

(10) Patent No.: US 9,324,569 B2
(45) Date of Patent: Apr. 26, 2016

(54) PLASMA ETCHING METHOD AND PLASMA ETCHING APPARATUS

(71) Applicant: Tokyo Electron Limited, Tokyo (JP)

(72) Inventor: Takayuki Ishii, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/316,082

(22) Filed: Jun. 26, 2014

(65) Prior Publication Data

US 2015/0004795 A1   Jan. 1, 2015

(30) Foreign Application Priority Data

Jun. 28, 2013 (JP) .................................. 2013-137118

(51) Int. Cl.
*H01L 21/3065* (2006.01)
*H01L 21/311* (2006.01)
*H01L 21/3213* (2006.01)

(52) U.S. Cl.
CPC ...... *H01L 21/3065* (2013.01); *H01L 21/31116* (2013.01); *H01L 21/31122* (2013.01); *H01L 21/31138* (2013.01); *H01L 21/31144* (2013.01); *H01L 21/32139* (2013.01)

(58) Field of Classification Search
CPC ..................... H01L 21/3065; H01L 21/31116; H01L 21/32139
See application file for complete search history.

(56) References Cited

U.S. PATENT DOCUMENTS

| 9,054,045 B2 * | 6/2015 | Posseme et al. |
| 2009/0212010 A1 | 8/2009 | Wang et al. |
| 2010/0009542 A1 | 1/2010 | Honda et al. |
| 2010/0081286 A1 | 4/2010 | Kim et al. |

FOREIGN PATENT DOCUMENTS

| JP | H05291208 A | 11/1993 |
| JP | 2012-204668 | 10/2012 |

OTHER PUBLICATIONS

Machine translation of JP05-291208,A(1993) 11 pages.*

* cited by examiner

*Primary Examiner* — Duy Deo
*Assistant Examiner* — Mahmoud Dahimene
(74) *Attorney, Agent, or Firm* — Brundidge & Stanger, P.C.

(57) ABSTRACT

A groove shape can be improved. A plasma etching method includes plasma-processing a photoresist film that is formed on a mask film and has a preset pattern; exposing an organic film formed under the mask film by etching the mask film with the pattern of the plasma-processed photoresist film; and etching the organic film by plasma of a mixture gas containing $O_2$ (oxygen), COS (carbonyl sulfate) and $Cl_2$ (chlorine).

4 Claims, 8 Drawing Sheets

*FIG. 2*
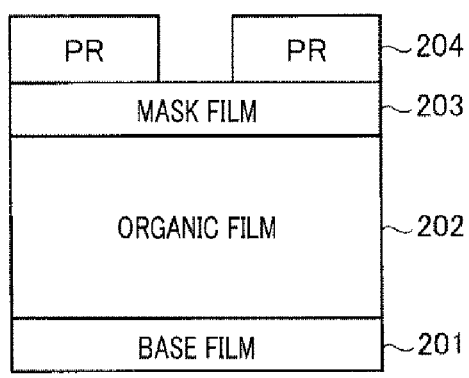
*FIG. 3A*  *FIG. 3B*  *FIG. 3C*  *FIG. 3D*
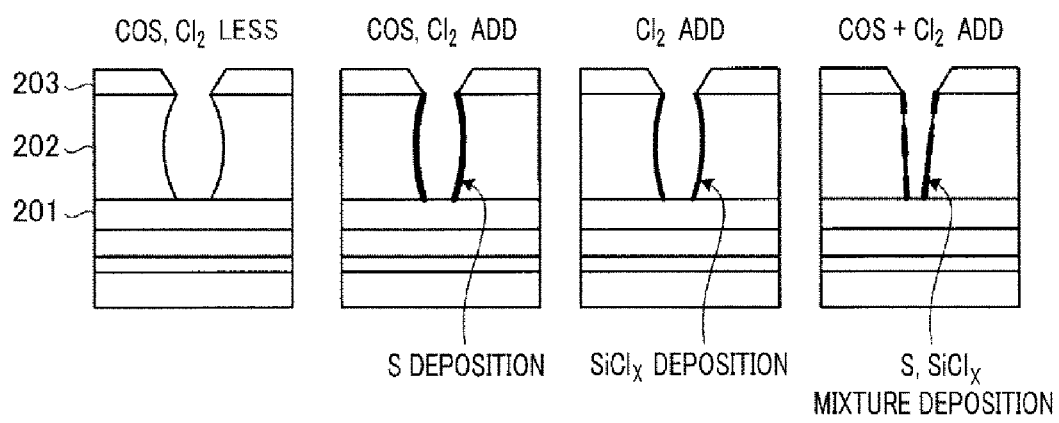

| FLOW RATE RATIO (COS/Cl$_2$) | TAPER ANGLE |
|---|---|
| 0.4 | 84.5° |
| 0.46 | 88.8° |
| 0.5 | 87.5° |

| FLOW RATE RATIO (O$_2$/COS+Cl$_2$) | CD RATIO (Top CD/Bottom CD) | TAPER ANGLE |
|---|---|---|
| 0.17 | 1.52 | 70° |
| 1.78 | 1.13 | 84.5° |
| 2.08 | 1.06 | 86.7° |
| 2.5 | 1.05 | 87.0° |
| 2.63 | 1.03 | 88.9° |
| 6.25 | 0.98 | 90.8° |

PLASMA ETCHING METHOD AND PLASMA ETCHING APPARATUS

CROSS-REFERENCE TO RELATED APPLICATION

This application claims the benefit of Japanese Patent Application No. 2013-137118 filed on Jun. 28, 2013, the entire disclosures of which are incorporated herein by reference

TECHNICAL FIELD

The embodiments described herein pertain generally to a plasma etching method and a plasma etching apparatus.

BACKGROUND

When forming a groove on a processing target film in a plasma etching process, it is known that bowing is generated, i.e., a sidewall of the groove is over-etched, rendering a space at a middle portion of the groove protruded. With the advance of miniaturization, due to this bowing problem, it becomes difficult to control a width of the groove as designed. As a resolution, described in Patent Document 1 is a technique of adding COS (carbonyl sulfide) to an etching gas.

Patent Document 1: Japanese Patent Laid-open Publication No. 2012-204668

Meanwhile when forming a groove on the processing target film in the etching process, if the sidewall of the groove is vertical, a reaction product (deposit) may be deposited on a bottom (corner portion) of the groove, thus affecting a performance of a device formed thereafter. By forming a slope (taper) of a certain inclination angle on the sidewall of the groove, it may be possible to remove the reaction product (deposit) readily, and in a subsequent process of depositing a film on the sidewall of the groove, the film may be easily formed. Conventionally, however, it has been difficult to form the taper while suppressing the bowing.

In the technique of Patent Document 1, although the bowing may be suppressed to some extent, it has been still difficult to form the taper on the sidewall of the groove.

SUMMARY

In one example embodiment, a plasma etching method of etching a substrate having thereon an organic film not containing Si (silicon), a mask film and a resist film having a preset pattern which are formed on top of each other in sequence includes forming a mask of the mask film by etching the mask film with the resist film as a mask; and etching the organic film not containing the Si by plasma of a mixture gas containing $O_2$ (oxygen), COS (carbonyl sulfide) and $Cl_2$ (chlorine) with the resist film and the mask of the mask film as a mask.

In accordance with the various aspects and embodiments, a plasma etching method and a plasma etching apparatus can improve a groove shape.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 is a schematic diagram for describing an example structure of a semiconductor wafer to be etched by the etching apparatus in accordance with the example embodiment;

FIG. 3A to FIG. 3D are schematic diagrams illustrating an example relationship between a processing gas and a groove shape;

DETAILED DESCRIPTION

Figure 1:
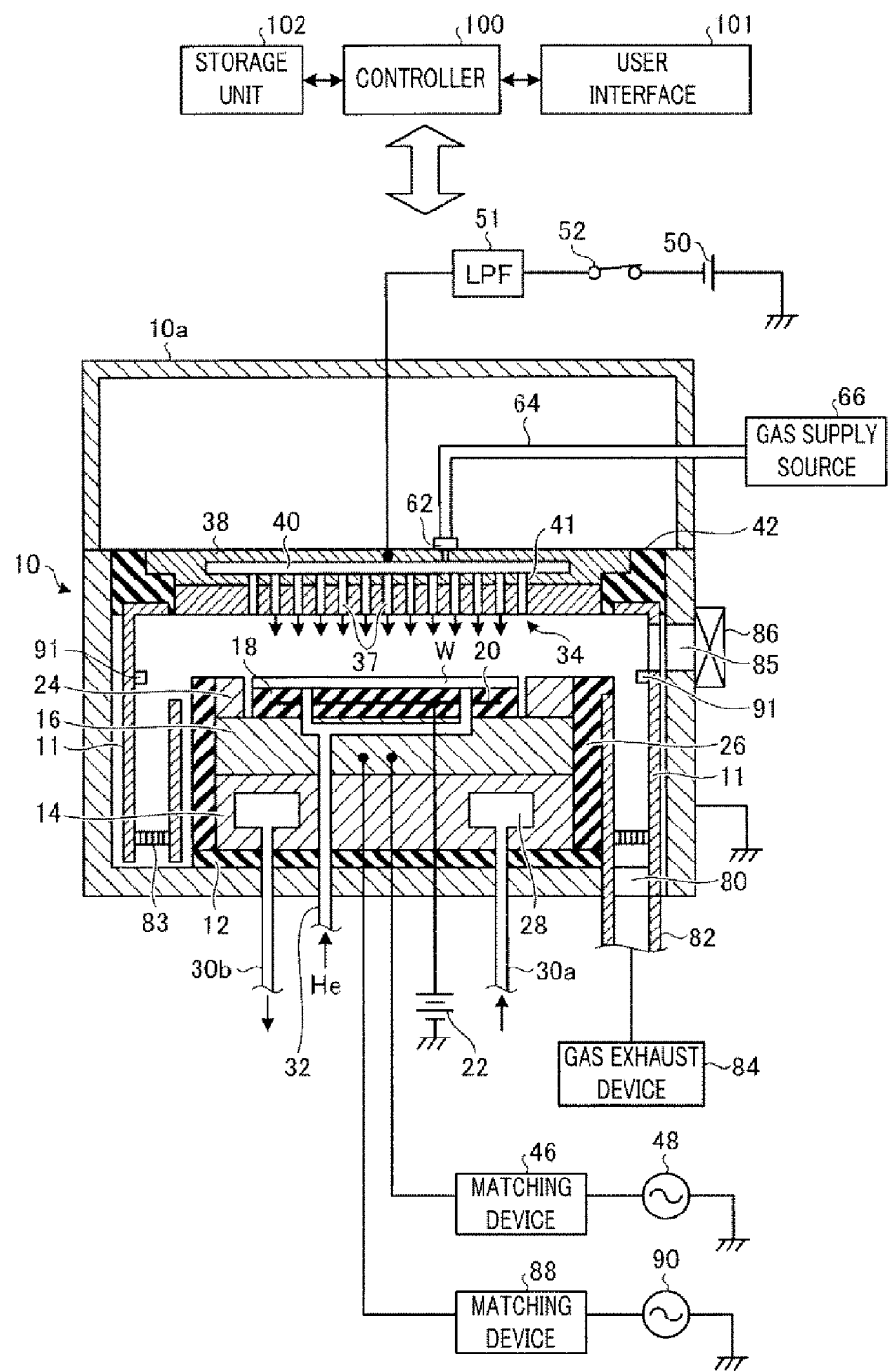
FIG. 1 is a longitudinal cross sectional view illustrating an example etching apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a longitudinal cross sectional view illustrating an example etching apparatus in accordance with an example embodiment. In the present example embodiment, the etching apparatus is configured as a parallel plate type plasma etching apparatus, and includes a substantially cylindrical chamber (processing vessel) 10 made of, but not limited to, aluminum having an anodically oxidized surface. The chamber 10 is frame-grounded.

A columnar susceptor supporting table 14 is disposed on an insulating plate 12 made of, e.g., ceramics which is placed on a bottom of the chamber 10. A susceptor 16 made of, but not limited to, aluminum is provided on the susceptor supporting table 14. The susceptor 16 serves as a lower electrode, and a semiconductor wafer W, which is a processing target substrate, is mounted on the susceptor 16. The semiconductor wafer W has thereon an organic film, which is a target of etching in the example embodiment.

An electrostatic chuck 18 configured to attract and hold the semiconductor wafer W by an electrostatic force is provided on a top surface of the susceptor 16. The electrostatic chuck 18 includes an electrode 20 embedded in an insulating layer made of a dielectric material such as $Al_2O_3$. The electrode 20 is made of a conductive film, and a DC power supply 22 is electrically connected to the electrode 20. The semiconductor wafer W is attracted to and held on the electrostatic chuck 18 by the electrostatic force such as a Coulomb force generated by a DC voltage applied from the DC power supply 22.

A conductive focus ring (correction ring) 24 configured to improve the etching uniformity is provided on a top surface of the susceptor 16 to surround the electrostatic chuck 18 (semiconductor wafer W). The focus ring 24 is made of, by way of non-limiting example, silicon. A cylindrical inner wall member 26 made of, but not limited to, quartz is attached to side surfaces of the susceptor 16 and the susceptor supporting table 14.

A coolant path 28 is formed within the susceptor supporting table 14 along the circumference thereof, for example. A coolant of a preset temperature, i.e., cooling water is supplied into and circulated through the coolant path 28 from a non-illustrated external chiller unit via pipelines 30a and 30b. A processing temperature of the semiconductor wafer W on the susceptor 16 may be controlled by adjusting the temperature of the coolant.

A cold heat transfer gas (cooling gas) such as a He gas from a non-illustrated heat transfer gas supply device is supplied between a top surface of the electrostatic chuck 18 and a rear surface of the semiconductor wafer W through a gas supply line 32. With these configurations, it may be possible to control the semiconductor wafer W to a preset temperature.

An upper electrode 34 is provided above the susceptor 16, facing the susceptor 16 serving as the lower electrode in parallel. Plasma is generated in a space between the upper electrode 34 and the lower electrode 16.

The upper electrode 34 is supported at a ceiling of the chamber 10 via an insulating shield member 42. The upper electrode 34 serves as a facing surface that faces the susceptor 16, and has a multiple number of gas discharge holes 37. Further, the upper electrode 34 includes an electrode supporting body 38 which is made of, but not limited to, aluminum and has a water cooling structure. The electrode supporting body 38 has therein a gas diffusion space 40, and a multiple number of gas holes 41 communicating with the gas discharge holes 37 are extended downward from the gas diffusion space 40.

The electrode supporting body 38 has a gas inlet opening 62 through which a processing gas is introduced into the gas diffusion space 40. The gas inlet opening 62 is connected to a gas supply line 64, which is connected to a gas supply source 66 configured to supply a preset processing gas for a process. Multiple gas lines may be connected to the gas supply line 64, and each of the gas lines is provided with a flow rate controller (not shown) and an opening/closing valve (not shown). The processing gas is introduced into the gas diffusion space 40 from the gas supply source 66 through the gas supply line 64, and then, is discharged into a plasma generation space through the gas holes 41 and the gas discharge holes 37, as in a shower shape. That is, the upper electrode 34 serves as a shower head configured to supply the processing gas.

A variable DC power supply 50 is electrically connected to the upper electrode 34 via a low pass filter (LPF) 51. Here, a negative electrode of the variable DC power supply 50 is connected to the upper electrode 34, and the variable DC power supply 50 is configured to apply a negative voltage to the upper electrode 34. A power supply from the variable DC power supply 50 is turned on and off by an on/off switch 52. The low pass filter (LPF) 51 is configured to trap high frequency powers from a first and a second high frequency power supply to be described below. Desirably, the low pass filter (LPF) 51 may be composed of an LR filter or an LC filter.

A cylindrical grounding conductor 10a is extended upward from the sidewall of the chamber 10 to be located above the upper electrode 34.

The susceptor 16 serving as the lower electrode is electrically connected to a first high frequency power 48 via a first matching device 46. The first high frequency power supply 48 is configured to output a high frequency power of a frequency ranging from, e.g., about 27 MHz to about 100 MHz, e.g., about 60 MHz. The first matching device 46 is configured to match a load impedance with an internal (or output) impedance of the first high frequency power supply 48. The first matching device 46 may control the output impedance to be apparently matched with the load impedance.

Further, the susceptor 16 serving as the lower electrode is also electrically connected to a second high frequency power supply 90 via a second matching device 88. By supplying a high frequency power from the second high frequency power supply 90 to the susceptor 16 configured as the lower electrode, a high frequency bias is applied to the semiconductor wafer W, so that ions are attracted into the semiconductor wafer W. The second high frequency power supply 90 is configured to output a high frequency power of a frequency ranging from, e.g., about 400 kHz to about 20 MHz, e.g., about 13.56 MHz. The second matching device 88 is configured to match a load impedance with an internal (or output) impedance of the second high frequency power supply 90. The second matching device 88 may control the internal impedance of the second high frequency power supply 90 to be apparently matched with the load impedance including the plasma within the chamber 10.

A gas exhaust opening 80 is formed at a bottom of the chamber 10. A gas exhaust device 84 is connected to the gas exhaust opening 80 via a gas exhaust line 82. The gas exhaust device 84 includes a vacuum pump such as a turbo molecular pump, and is configured to depressurize the inside of the chamber 10 to a required vacuum level. Further, a loading/unloading opening 85 for the semiconductor wafer W is formed at a sidewall of the chamber 10, and the loading/unloading opening 85 is opened or closed by a gate valve 86. Further, a deposition shield 11 configured to prevent adhesion of an etching byproduct (deposit) to the chamber 10 is detachably provided along an inner wall of the chamber 10. That is, the deposition shield 11 forms a chamber wall. The deposition shield 11 is also provided at an outer periphery of the inner wall member 26. A gas exhaust plate 83 is provided between the deposition shield 11 on a side of the chamber wall and the deposition shield 11 on a side of the inner wall member 26 at the bottom of the chamber 10. Desirably, the deposition shield 11 and the gas exhaust plate 83 may be made of, but not limited to, aluminum coated with ceramics such as $Y_2O_3$.

A conductive member (GND block) 91 which is connected to the ground in a DC manner is provided on the deposition shield 11 on the side of the chamber inner wall to have a height position substantially same level with the semiconductor wafer W. This conductive member 91 may exert an abnormal discharge preventing effect. Here, the position of the conductive member 91 may not be limited to the example shown in FIG. 1 as long as it is provided within the plasma generation space. By way of example, the conductive member 91 may be provided on the side of the susceptor 16, e.g., around the susceptor 16. Alternatively, the conductive member 91 may be provided in the vicinity of the upper electrode 34, e.g., in a ring-shape at an outer side of the upper electrode 34.

Individual components of the plasma etching apparatus, e.g., the power supply system, the gas supply system, the driving system, the first and second high frequency power supplies 48 and 90, the matching devices 46 and 88, and so forth are connected to and controlled by a controller (overall control device) 100 including a microprocessor (computer). Further, connected to the controller 100 is a user interface 101 including a keyboard through which an operator inputs a command to manage the plasma etching apparatus; a display that visually displays an operational status of the plasma etching apparatus, and so forth Also connected to the controller 100 is a storage unit 102 configured to store therein control programs for implementing various processes in the plasma etching apparatus under the control of the controller 100, or programs for implementing a process in each component of the plasma etching apparatus according to processing conditions, i.e., processing recipes. The processing recipes may be stored in a storage medium within the storage unit 102. The storage medium may be a hard disk or a semiconductor memory, or may be a portable device such as a CD ROM, a DVD or a flash memory. Alternatively, the processing recipes may be appropriately received from another apparatus through, for example, a dedicated line.

A necessary recipe may be retrieved from the storage unit 102 and executed by the controller 100 in response to an instruction from the user interface 101 or the like, so that a required process may be performed in the plasma etching apparatus.

The controller 100 may control each component of the plasma etching apparatus to perform a plasma etching method to be described below. One example will be elaborated. The controller 100 controls each component of the plasma etching apparatus to plasma-process a photoresist film 204 formed on a mask film 203 and having a certain pattern. Then, the controller 100 controls each component of the plasma etching apparatus to etch the mask film 203 by plasma with the plasma-processed photoresist film 204, so that an organic film 202 formed under the mask film 203 is exposed. Then, the controller 100 controls each component of the plasma etching apparatus to etch the organic film 202 by plasma of a mixture gas containing $O_2$, COS and $Cl_2$.

FIG. 2 is a schematic diagram illustrating an example structure of a semiconductor wafer to be etched in the plasma etching apparatus in accordance with the example embodiment. In the present example embodiment, a semiconductor wafer W having a structure as shown in FIG. 2 is used, for example.

The semiconductor wafer used in the present example embodiment includes, as shown in FIG. 2, a base film 201, an organic film 202, a mask film (inorganic film) 203, a BARC (organic film) and a photoresist (PR) film 204 formed on top of each other in sequence. The photoresist film 204 has a preset pattern which is formed by the photolithography.

As the organic film 202 which is an etching target film in the present example embodiment, any of organic films typically used in this field may be utilized as long as silicon is not contained therein. Desirably, SOC (Spin On Carbon), SOH (Spin On Hard mask), or the like may be used, for example. Further, amorphous carbon (a-C) film is one of an etching target film in the present example embodiment. A thickness of the organic film 202 may be set to be in a range from, e.g., about 100 nm to about 1000 nm, e.g., about 200 nm.

As an example of the mask film 203, a SiON film (silicon oxynitride film) may be used, desirably. The mask film 203 may have a thickness ranging from, e.g., about 10 nm to about 100 nm. For example, the antireflection film and the SiON film may have thicknesses of, e.g., about 12 nm and about 20 nm, respectively. The photoresist film 204 may be typically an ArF (argon fluoride) resist having a thickness ranging from, e.g., about 20 nm to about 200 nm.

Now, operations of the plasma etching in accordance with the present example embodiment will be described with reference to FIG. 3A to FIG. 3D. FIG. 3A to FIG. 3D are schematic diagrams showing an example relationship between a processing gas and a groove shape. FIG. 3A is a schematic diagram illustrating an example groove shape in case of etching the organic film 202 by plasma of a CF-based processing gas containing neither COS nor $Cl_2$ with the mask film 203 as a mask. As depicted in FIG. 3A, in the shape of a groove formed in the organic film 202, a center of the groove is protruded, as compared to a width of an opening or a bottom of the groove. That is, the bowing is generated. For the reason, in order to allow the groove to have a designed width, the opening of the groove in the organic film 202 needs to be narrowed by reducing a width of a pattern formed in the mask film 203 in a BT process of etching the mask film, in consideration of the protruded center portion of the groove that might be caused by the bowing.

In order to narrow the width of the pattern of the mask film 203 while maintaining high accuracy, high level of microprocessing technique is required. Further, even if it is possible to form a groove having a narrow opening in the organic film 202 by the etching, it may be difficult to remove deposits collected within the groove in a subsequent process or difficult to form a uniform film on an inner wall of the groove formed in the organic film 202, since the width of the opening of the groove is narrower than the width of the inside of the groove.

Here, if it is possible to form a slope (taper) on the inner wall of the groove to allow the width of the opening of the groove to be larger than the width of the bottom of the groove, the deposits collected within the groove may be easily removed, and a uniform film may also be easily formed on the inner wall of the groove in a semiconductor manufacturing process. To achieve high densification, however, the slope of the inner wall of the groove should not be set to be excessively gentle. In consideration of both aspects, a taper angle needs to be in a range from, e.g., about 84° to about 89°, desirably. More desirably, the taper angle may be in a range from, e.g., about 84° to about 86°.

A COS gas is known as an additive gas capable of suppressing the bowing. FIG. 3B is a schematic diagram illustrating an example groove shape in case of etching the organic film 202 by plasma of a processing gas containing a COS gas as an additive or a processing gas composed of a COS single gas with the mask film 203 as a mask. As depicted in FIG. 3B, if the COS gas is added to the processing gas, a sulfur (S) deposit originated from ions of a S component generated in the plasma may adhere to an inner wall of a groove, thus suppressing the bowing to some extent during the etching process. However, such suppression of the bowing through the use of the COS gas may not be sufficient, and a taper shape is not formed. Thus, there is still a demand for a design considering the bowing suppression and the taper shape.

FIG. 3C is a schematic diagram illustrating an example groove shape in case of etching the organic film 202 by plasma of a processing gas containing a $Cl_2$ gas as an additive or a processing gas composed of a $Cl_2$ single gas with the mask film 203 as a mask. As depicted in FIG. 3C, as in the case of using the COS gas, if the $Cl_2$ gas is added to the processing gas, a $SiCl_x$ deposit originated from ions of $SiCl_x$ (silicon chloride) component generated in the plasma may adhere to an inner wall of a groove, thus suppressing the bowing to some extent during the etching process. However, such suppression of the bowing through the use of the $Cl_2$ gas may not be sufficient, and a taper shape is not formed. Thus, there is still a demand for a design considering the bowing suppression and the taper shape.

In this regard, in an organic film etching process in accordance with the present example embodiment, the organic film 202 is etched by plasma of a processing gas containing an $O_2$ gas/a $Cl_2$ gas/a COS gas. FIG. 3D is a schematic diagram illustrating an example groove shape in case of etching the organic film 202 by plasma of the processing gas containing the $O_2$ gas/the $Cl_2$ gas/the COS gas with the mask film 203 as a mask.

Through researches, the present inventor has found out that if the COS gas and the $Cl_2$ gas are added to a processing gas, a deposit of a mixture of S and $SiCl_x$ originated from ions of the S component and the $SiCl_x$ component generated in the plasma may adhere to an inner wall of a groove, thus suppressing generation of the bowing greatly during the etching process. Accordingly, the inner wall of the groove may be formed to have a taper shape, thus making it possible to remove deposits collected within the groove in a subsequent process or to form a uniform film on the inner wall of the groove. As stated above, after forming a groove having a desirable CD or a taper shape by etching the organic film according to the etching method of the present example embodiment, the base film 201 such as a SiON film, TiN (metal hard mask) or the like may be plasma-etched with the organic film 202 as a mask, so that it may be possible to form, in the base film 201, a groove having a required CD and shape with high accuracy. Further, by etching a film formed under the base film with the base film as a mask, it may be also possible to form a groove having a desirable shape. Accordingly, performance and yield of semiconductor devices may be improved.

<Example Embodiment of Plasma Etching Method>

Figure 4:
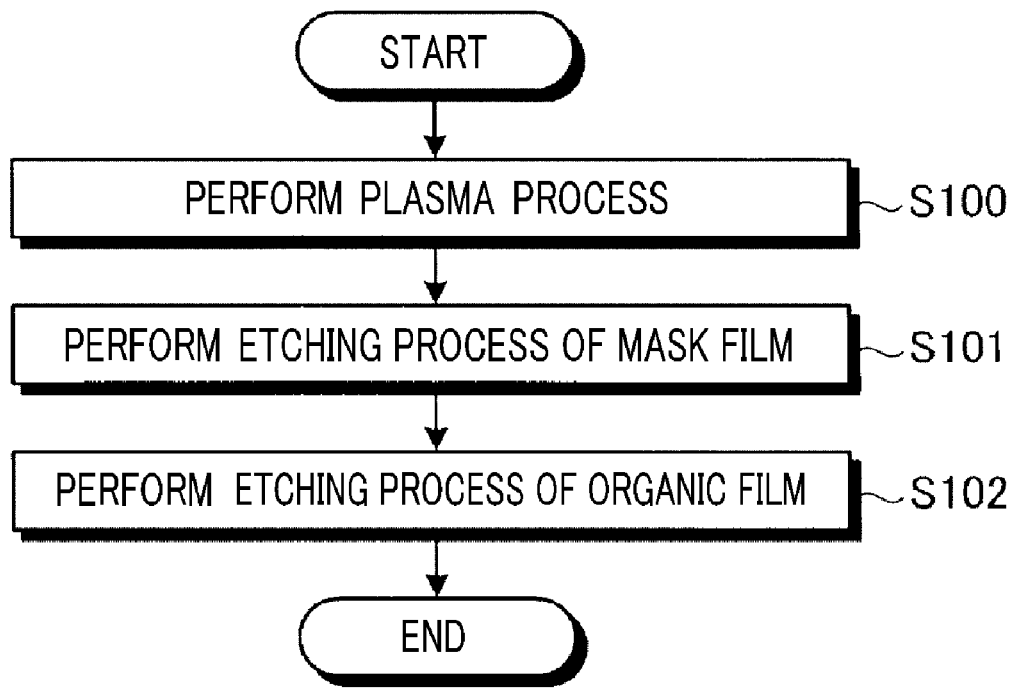
FIG. 4 is a flowchart for describing an example sequence of an etching method in accordance with the example embodiment.

Now, respective processes of the plasma etching method in accordance with the example embodiment will be elaborated. FIG. 4 is a flowchart for describing an example sequence of the plasma etching method in accordance with the present example embodiment.

In the plasma etching method of the present example embodiment, as depicted in FIG. 4, at block S100 (perform plasma process), a wafer W as a processing target object is loaded into the chamber 10, and then, mounted on the susceptor 16. Then, the controller 100 exhausts the inside of the chamber 10 to a preset pressure through the gas exhaust opening 80 by the vacuum pump of the gas exhaust device 84. Then, by supplying a processing gas into the chamber 10, the controller 100 performs a plasma process.

By way of example, the controller 100 supplies a hydrogen-containing processing gas into the chamber 10 from the gas supply source 66. Then, the controller 100 performs a plasma process on a surface of a photoresist film by using plasma of the hydrogen-containing processing gas, thus hardening the resist film. This plasma process is also called a curing process. Through this curing process, SWR (Side Wall Roughness) or LEF (Line Edge Roughness) of the photoresist film used as the mask is improved.

To elaborate, the controller 100 performs the plasma process of the photoresist film 204 under the following conditions, for example.

Pressure within chamber 10: about 10 mT

High frequency power supplied to upper electrode 34: about 200 W

Frequency of high frequency power supplied to upper electrode 34: about 60 MHz High frequency power supplied to lower electrode (susceptor 16): about 0 W Supplied gases and flow rate ratio: $H_2$ (hydrogen)/$N_2$ (nitrogen)/$CH_4$ (methane)=about 180 sccm/about 60 sccm/about 10 sccm Pressure of cooling gas: about 20 Torr/about 20 Torr Temperature of upper electrode 34: about 90° C.

Temperature of inner wall of chamber 10: about 60° C.

Temperature of center of susceptor 16: about 15° C.

Temperature of edge of susceptor 16: about 5° C.

Subsequently, at block S101 (perform etching process of mask film), the controller 100 exhausts the inside of the chamber 10 and performs an etching process on a mask film 203 by supplying a processing gas into the chamber 10. By way of example, the controller 100 supplies a processing gas containing a CF-based gas and a CH-based gas into the chamber 10 from the gas supply source 66, and then, etches the mask film 203 containing BARC (organic film) and silicon by plasma of the processing gas containing the CF-based gas and the CH-based gas with the plasma-processed photoresist film 204 as a mask. As a result, an organic film 202 not containing Si formed under the mask film 203 is exposed. This etching process of the mask film 203 may also be referred to as a BT (Break Through) process. In this case, the photoresist film 204 such as ArF is left on the mask film 203 in a certain thickness.

To be more specific, the controller 100 performs the etching process of the mask film 203 under the following conditions, for example.

Pressure within chamber 10: about 15 mT

High frequency power supplied to upper electrode 34: about 500 W

Frequency of high frequency power supplied to upper electrode 34: about 60 MHz High frequency power supplied to lower electrode (susceptor 16): about 100 W Frequency of high frequency power supplied to lower electrode (susceptor 16): about 13 MHz Supplied gases and flow rate ratio: $CF_4$ (Tetrafluoromethane)/$CH_4$/$O_2$=about 250 sccm/about 20 sccm/about 8 sccm Pressure of cooling gas: about 20 Torr/about 20 Torr Temperature of upper electrode 34: about 90° C.

Temperature of inner wall of chamber 10: about 60° C.

Temperature of center of susceptor 16: about 15° C.

Temperature of edge of susceptor 16: about 5° C.

Thereafter, at block S102 (perform etching process of organic film), the controller 100 exhausts the inside of the chamber 10 and performs an etching process on the organic film 202 not containing Si by supplying a processing gas into the chamber 10. By way of example, the controller 100 supplies a processing gas containing COS and $Cl_2$ into the chamber 10 from the gas supply source 66, and then, etches the organic film 202 not containing Si by plasma of the processing gas containing the COS gas and the $Cl_2$ gas with the residual photoresist film 204 and the mask film 203 as a mask.

To be more specific, the controller 100 performs the etching of the organic film 202 not containing Si under the following conditions, for example.

Pressure within chamber 10: about 10 mT
High frequency power supplied to upper electrode 34: about 500 W
Frequency of high frequency power supplied to upper electrode 34: about 60 MHz
High frequency power supplied to lower electrode (susceptor 16): about 200 W
Frequency of high frequency power supplied to lower electrode (susceptor 16): about 13.56 MHz
Supplied gases: $O_2$/He (helium)/$Cl_2$/COS
Pressure of cooling gas: about 20 Torr/about 20 Torr
Temperature of upper electrode 34: about 90° C.
Temperature of inner wall of chamber 10: about 60° C.
Temperature of center of susceptor 16: about 15° C.
Temperature of edge of susceptor 16: about 5° C.

In the etching process of the organic film 202 not containing Si, since a large amount of $O_2$ and He are contained in the processing gas supplied into the chamber 10, plasma is difficult to be generated. Thus, it may be desirable that the controller 100 increases the pressure within the chamber 10 to about 20 mT temporarily to generate plasma, and then, reduces the pressure within the chamber 10 to a processing pressure of about 10 mT after the plasma is stably generated.

Experimental Example 1

By using the wafer having the film structure as illustrated in FIG. 2, the etching process is performed while varying flow rates of a COS gas and a $Cl_2$ gas, and a relationship between a flow rate ratio between the gases, a CD and a taper angle is investigated. In this experiment, a wafer having a mask film 203 of, e.g., about 28 nm, an organic film 202 of, e.g., about 170 nm and a base film 201 of, e.g., about 40 nm is used. In this experiment, three different processing conditions are set as follows.

Supplied gases: $O_2$/He/$Cl_2$/COS=about 50 sccm/about 160 sccm/about 20 sccm/about 8 sccm (1)

about 50 sccm/about 160 sccm/about 13 sccm/about 6 sccm (2)

about 50 sccm/about 160 sccm/about 16 sccm/about 8 sccm (3)

A desirable flow rate of the COS gas may be in a range from, e.g., about 3 sccm to about 10 sccm; the $Cl_2$ gas, in a range from, e.g., about 10 sccm to about 25 sccm; the He gas, in a range from e.g., about 100 sccm to about 200 sccm; and the $O_2$ gas, in a range from e.g., about 45 sccm to about 100 sccm. The other conditions are the same as those in the above-described etching process for the organic film.

Figure 5A:
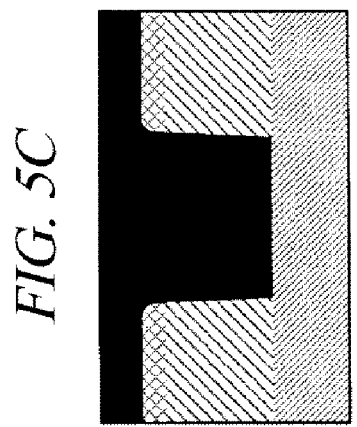
FIG. 5A to FIG. 5C are diagrams showing example experiment results of cross sections of grooves in case of performing the etching process by using a processing gas containing a COS gas and a $Cl_2$ gas.
Figure 5B:
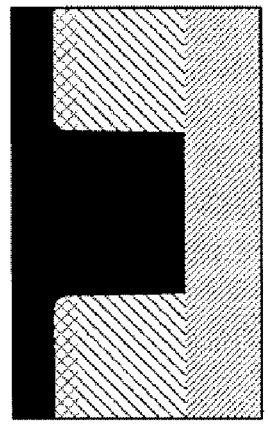
Figure 5C:
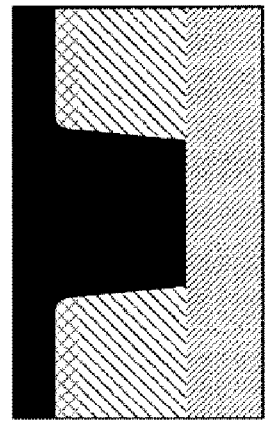

FIG. 5A to FIG. 5C illustrate example experiment results of cross sections of grooves in cases of performing the etching process by plasma of processing gases containing the COS gas and the $Cl_2$ gas. FIG. 5A shows a cross section of a groove in case of performing the etching process by using a processing gas having a flow rate ratio as specified in (1); FIG. 5B illustrates a cross section of a groove in case of performing the etching process by using a processing gas having a flow rate ratio specified in (2); and FIG. 5C illustrates a cross section of a groove in case of performing the etching process by using a processing gas having a flow rate ratio as specified in (3).

In case of performing the etching by using the processing gas having the flow rate ratio as specified in (1), a width of an opening of the groove is larger than a width of a bottom of the groove, and an inclination on a sidewall of the groove is found to fall within an effective range, as shown in FIG. 5A. In FIG. 5A, the width of the opening of the groove is found to be about 271 nm, whereas the width of the bottom of the groove is found to be about 239 nm. In the processing gas having the flow rate ratio specified in (1), a flow rate ratio of the COS gas to the $Cl_2$ gas is, e.g., about 0.4.

Further, in case of performing the etching by using the processing gas having the flow rate ratio as specified in (2), the width of the opening of the groove is also larger than the width of the bottom of the groove, and a taper is formed on the sidewall of the groove, as illustrated in FIG. 5B. In FIG. 5B, the width of the opening of the groove is found to be about 264 nm, whereas the width of the bottom of the groove is found to be about 257 nm. Further, in the processing gas having the flow rate ratio specified in (2), the flow rate ratio of the COS gas to the $Cl_2$ gas is, e.g., about 0.46.

Further, in case of performing the etching by using the processing gas having the flow rate ratio as specified in (3), the width of the opening of the groove is also larger than the width of the bottom of the groove, and a taper is also formed on the sidewall of the groove, as illustrated in FIG. 5C. In FIG. 5C, the width of the opening of the groove is found to be about 270 nm, whereas the width of the bottom of the groove is found to be about 255 nm. Further, in the processing gas having the flow rate ratio specified in (3), the flow rate ratio of the COS gas to the $Cl_2$ gas is, e.g., about 0.5.

Figures 6, 7:
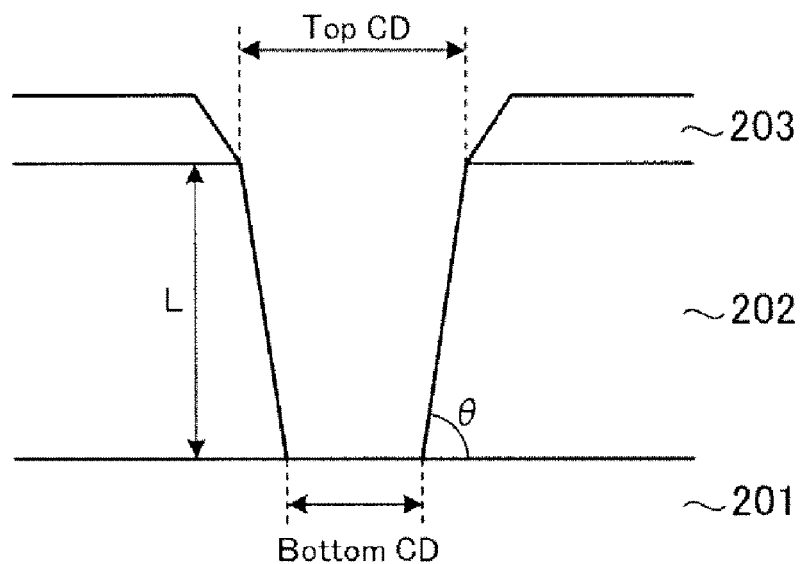
FIG. 6 is a schematic diagram for describing a definition of a taper angle.
FIG. 7 is a diagram showing an example calculation result of the taper angle with respect to a flow rate ratio between a COS gas and a $Cl_2$ gas.

Here, in the present specification, an angle θ as shown in FIG. 6, for example, is defined as a "taper angle". The taper angle θ is calculated by using the following equation (4), for example. Here, Top CD denotes a width of an opening of a groove; Bottom CD, the width of the bottom of the groove; and L, a depth of the groove (i.e., a thickness of the organic film 202).

$$\theta = \tan^{-1}\{L/((\text{Top CD} - \text{Bottom CD})/2)\} \quad (4)$$

Figure 8:
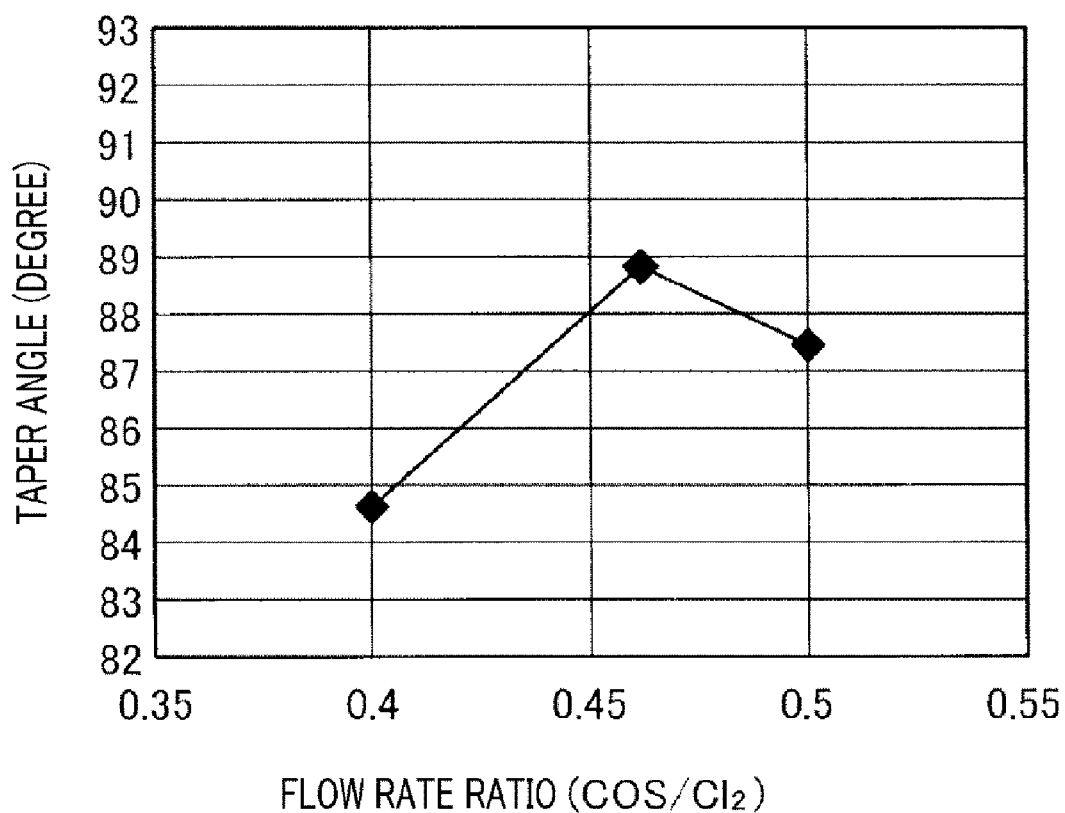
FIG. 8 is a graph showing an example variation in the taper angle with respect to the flow rate ratio between the COS gas and the $Cl_2$ gas.

From the shape of the groove formed in each of the cases of performing the etching by using the processing gases of the flow rate ratios specified in (1) to (3), the taper angle is calculated from the Top CD and the Bottom CD, and the calculation results are provided in FIG. 7, for example. Further, if the calculation results of the taper angle are plotted, a graph as shown in FIG. 8 is obtained, for example. FIG. 7 provides an example calculation result of the taper angle with respect to the flow rate ratio between the COS gas and the $Cl_2$ gas. FIG. 8 is a graph showing an example variation in the taper angle with respect to the flow rate ratio between the COS gas and the $Cl_2$ gas.

As can be seen from FIG. 7 and FIG. 8, as the flow rate ratio of the COS gas to the $Cl_2$ gas increases, the taper angle also tends to increase. It may be desirable that the taper angle falls within a range from, e.g., about 84° to about 89°. As can be seen from the results of FIG. 7 and FIG. 8, if the flow rate ratio of the COS gas to the $Cl_2$ gas is set to be in a range from, e.g., about 0.4 to about 0.5, the taper angle is found to be in the desirable range from about 84° to about 89° while the bowing is suppressed.

Further, the present inventor has conducted further researches and found out that if the flow rate ratio of the COS gas to the $Cl_2$ gas is set to be in the range from, e.g., about 0.35 to about 0.5, the taper angle may fall within the desirable range from about 84° to about 89° while the bowing is suppressed effectively. From the foregoing, it may be desirable that the flow rate ratio of the COS gas to the $Cl_2$ gas in the processing gas is set to be in the range from, e.g., about 0.35 to about 0.5.

More desirably, the taper angle may be in a range from, e.g., about 84° to about 86°. Here, referring to the results of FIG. 7 and FIG. 8, if the flow rate ratio of the COS gas to the $Cl_2$ gas is, e.g., about 0.4, the taper angle is found to be in the more desirable range from about 84° to about 86° while the bowing is suppressed. Further, the present inventor has conducted further researches and found out that if the flow rate ratio of the COS gas to the $Cl_2$ gas is set to be in a range from, e.g., about 0.35 to about 0.45, the taper angle may fall within the desirable range from about 84° to about 86° while the bowing is suppressed effectively. Thus, it may be more desirable that the flow rate ratio of the COS gas to the $Cl_2$ gas in the processing gas is set to be in the range from, e.g., about 0.35 to about 0.45.

Experimental Example 2

By using the wafer having the film structure as illustrated in FIG. 2, the etching process is conducted while varying a flow rate of an $O_2$ gas with respect to a COS gas and a $Cl_2$ gas, and a relationship between a flow rate ratio between these gases, a CD and a taper angle is investigated. In this experiment, three different processing conditions are set as follows.

Supplied gases: $O_2$/He/$Cl_2$/COS=about 40 sccm/about 160 sccm/about 20 sccm/about 8 sccm     (5)

about 50 sccm/about 160 sccm/about 20 sccm/about 8 sccm     (6)

about 70 sccm/about 160 sccm/about 20 sccm/about 8 sccm     (7)

A desirable flow rate of the COS gas may be in a range from, e.g., about 3 sccm to about 10 sccm; the $Cl_2$ gas, in a range from, e.g., about 10 sccm to about 25 sccm; the He gas, in a range from e.g., about 100 sccm to about 200 sccm; and the $O_2$ gas, in a range from e.g., about 45 sccm to about 100 sccm. The other conditions are the same as those of the etching process for the organic film in the experimental example 1.

Figure 9A:
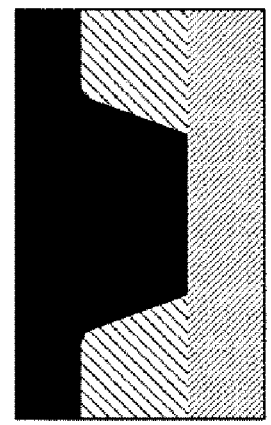
FIG. 9A to FIG. 9C are diagrams showing example experiment results of cross sections of grooves in case of performing the etching process by using a processing gas containing a COS gas, a $Cl_2$ gas and an $O_2$ gas.
Figure 9B:
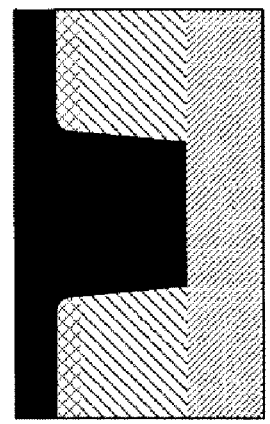
Figure 9C:
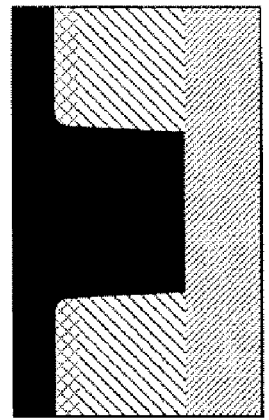

FIG. 9A to FIG. 9C illustrate example experiment results of cross sections of grooves in cases of performing the etching process by plasma of processing gases containing the COS gas, the $Cl_2$ gas and the $O_2$ gas. FIG. 9A shows a cross section of a groove in case of performing the etching process by using a processing gas having a flow rate ratio as specified in (5); FIG. 9B illustrates a cross section of a groove in case of performing the etching process by using a processing gas having a flow rate ratio specified in (6); and FIG. 9C illustrates a cross section of a groove in case of performing the etching process by using a processing gas having a flow rate ratio as specified in (7).

In case of performing the etching by using the processing gas having the flow rate ratio as specified in (5), a width of an opening of the groove is excessively larger than a width of a bottom of the groove, and an inclination on a sidewall of the groove is excessively small, as shown in FIG. 9A. In FIG. 9A, the width of the opening of the groove is found to be about 381 nm, whereas the width of the bottom of the groove is found to be about 250 nm. In this case, a CD ratio indicating a ratio of the opening width (Top CD) of the groove to the bottom width (Bottom CD) of the groove is about 1.52. In the processing gas having the flow rate ratio specified in (5), a ratio of a flow rate of the $O_2$ gas to the sum of flow rates of the COS gas and the $Cl_2$ gas is, e.g., about 1.43.

Further, in case of performing the etching by using the processing gas having the flow rate ratio as specified in (6), the width of the opening of the groove is larger than the width of the bottom of the groove, and an inclination on the sidewall of the groove falls within an effective range, as illustrated in FIG. 9B. In FIG. 9B, the width of the opening of the groove is found to be about 271 nm, whereas the width of the bottom of the groove is found to be about 239 nm. In this case, a CD ratio is found to be about 1.13. Further, in the processing gas having the flow rate ratio specified in (6), the ratio of the flow rate of the $O_2$ gas to the sum of the flow rates of the COS gas and the $Cl_2$ gas is, e.g., about 1.78.

Further, in case of performing the etching by using the processing gas having the flow rate ratio as specified in (7), the width of the opening of the groove is larger than the width of the bottom of the groove, but the taper angle on the sidewall of the groove is sharp, as illustrated in FIG. 9C. In FIG. 9C, the width of the opening of the groove is found to be about 279 nm, whereas the width of the bottom of the groove is found to be about 265 nm. In this case, the CD ratio is found to be about 1.05. Further, in the processing gas having the flow rate ratio specified in (7), the ratio of the flow rate of the $O_2$ gas to the sum of the flow rates of the COS gas and the $Cl_2$ gas is, e.g., about 2.5.

Figures 10, 11:
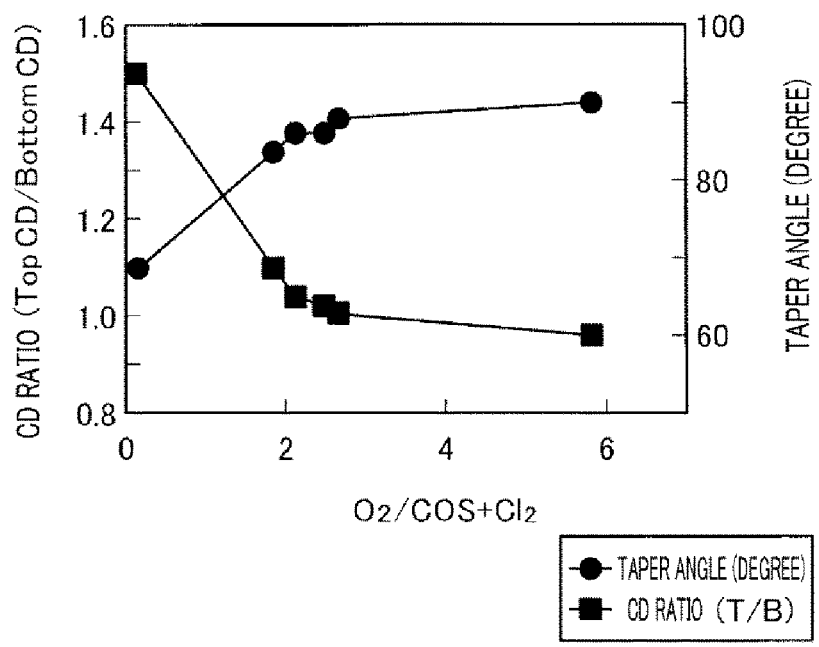
FIG. 10 is a diagram showing example calculation results of a taper angle and a CD ratio with respect to a ratio of a flow rate of an $O_2$ gas to the sum of flows rates of a COS gas and a $Cl_2$ gas.
FIG. 11 is a graph showing example variations in the taper angle and the CD ratio with respect to the ratio of the flow rate of the $O_2$ gas to the sum of the flows rates of the COS gas and the $Cl_2$ gas.

From the shape of the groove formed in each of the cases of performing the etching by using the processing gases of the flow rate ratios specified in (5) to (7), the CD ratio and the taper angle are calculated from the Top CD and the Bottom CD, and the calculation results are provided in FIG. 10, for example. Further, if the calculation results of the CD ratio and the taper angle are plotted, a graph as shown in FIG. 11 is obtained, for example. FIG. 10 provides example calculation results of the CD ratio and the taper angle with respect to the ratio of the flow rate of the $O_2$ gas to the sum of the flow rates of the COS gas and the $Cl_2$ gas. FIG. 11 is a graph showing example variations in the CD ratio and the taper angle with respect to the ratio of the flow rate of the $O_2$ gas to the sum of the flow rates of the COS gas and the $Cl_2$ gas.

As can be seen from the experimental results of FIG. 10 and FIG. 11, if the ratio of the flow rate of the $O_2$ gas to the sum of the flow rates of the COS gas and the $Cl_2$ gas increases, the CD ratio tends to decreases, whereas the taper angle tends to increase.

Further, referring to the experimental results of FIG. 10 and FIG. 11, it may be desirable that the ratio of the flow rate of the $O_2$ gas to the sum of the flow rates of the COS gas and the $Cl_2$ gas is set to be in a range from, e.g., about 1.78 to about 2.63. In such a case, the taper angle is found to be in a desirable range from, e.g., about 84° to about 89°.

Further, the present inventor has conducted further researches and found out that if the ratio of the flow rate of the $O_2$ gas to the sum of the flow rates of the COS gas and the $Cl_2$ gas is in a range from e.g., about 1.5 to about 2.7, the taper angle may fall within the desirable range from about 84° to about 89°. Thus, it may be desirable that the ratio of the flow rate of the $O_2$ gas to the sum of the flow rates of the COS gas and the $Cl_2$ gas in the processing gas is set to be in the range from, e.g., about 1.5 to about 2.7.

Further, as can be seen from the experimental results of FIG. 10 and FIG. 11, if the ratio of the flow rate of the $O_2$ gas to the sum of the flow rates of the COS gas and the $Cl_2$ gas is about 1.78, the taper angle is found to be in a more desirable range from, e.g., about 84° to about 86°.

Further, the present inventor has conducted further researches and found out that if the ratio of the flow rate of the $O_2$ gas to the sum of the flow rates of the COS gas and the $Cl_2$ gas is in a range from e.g., about 1.7 to about 1.9, the taper angle may fall within the more desirable range from about 84° to about 86°. Thus, it may be more desirable that the ratio of the flow rate of the $O_2$ gas to the sum of the flow rates of the COS gas and the $Cl_2$ gas is set to be in the range from, e.g., about 1.7 to about 1.9. Hence, as gas conditions for forming a groove with a taper angle having a desirable range while suppressing the bowing, it may be desirable that the ratio of the flow rate of the $O_2$ gas to the sum of the flow rates of the COS gas and the $Cl_2$ gas is in the range from, e.g., about 1.5 to about 2.7, and the flow rate ratio of the COS gas to the $Cl_2$ gas is in the range from, e.g., about 0.35 to about 0.5.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma etching method of etching a substrate having thereon a target film, the target film including an organic film not containing Si (silicon) or the target film including an amorphous carbon (a-C) film, and a mask film and a resist film having a preset pattern which are formed on top of each other in sequence, the plasma etching method comprising:

etching the mask film with the resist film as a mask; and etching the target film including the organic film not containing the Si or the target film including the amorphous carbon (a-C) film by plasma of a mixture gas containing $O_2$ (oxygen), COS (carbonyl sulfide) and $Cl_2$ (chlorine) with the resist film and the mask film as a mask to form a groove in the target film, wherein a ratio of a flow rate of the COS to a flow rate of the $Cl_2$ is set to be in a range from about 0.35 to about 0.5 such that a slope is formed on an inner wall of the groove to allow a width of an opening of the groove to be larger than a width of a bottom of the groove and that a taper angle is in a range from about 84° to about 89° with respect to the ratio of the flow rate of the COS to the flow rate of the $Cl_2$.

2. The plasma etching method of claim 1, wherein the ratio of the flow rate of the COS to the flow rate of the $Cl_2$ is in a range from about 0.35 to about 0.45.

3. The plasma etching method of claim 1, wherein a ratio of a flow rate of the $O_2$ to a sum of flow rates of the COS and the $Cl_2$ is in a range from about 1.5 to about 2.7.

4. The plasma etching method of claim 3, wherein the ratio of the flow rate of the $O_2$ to the sum of the flow rates of the COS and the $Cl_2$ is in a range from about 1.7 to about 1.9.

* * * * *